United States Patent [19]

Hynecek

[11] Patent Number: 4,901,129
[45] Date of Patent: Feb. 13, 1990

[54] BULK CHARGE MODULATED TRANSISTOR THRESHOLD IMAGE SENSOR ELEMENTS AND METHOD OF MAKING

[75] Inventor: Jaroslav Hynecek, Richardson, Tex.

[73] Assignee: Texas Instruments Incorporated, Dallas, Tex.

[21] Appl. No.: 328,723

[22] Filed: Mar. 23, 1989

Related U.S. Application Data

[63] Continuation of Ser. No. 36,617, Apr. 10, 1987, abandoned.

[51] Int. Cl.[4] .................... H01L 27/14; H01L 29/18; H01L 27/02
[52] U.S. Cl. ........................ 357/30; 357/23.1; 357/23.12; 357/24; 357/41; 357/45; 357/47
[58] Field of Search .............. 357/24 LR, 24 M, 30 I, 357/30 H, 30 G, 30 R, 45, 24, 41, 23.1, 23.12, 47

[56] References Cited

U.S. PATENT DOCUMENTS

| | | | |
|---|---|---|---|
| 4,148,046 | 4/1979 | Hendrickson et al. | 357/45 |
| 4,240,093 | 12/1980 | Dingwall | 357/42 |
| 4,242,694 | 12/1980 | Koika et al. | 357/30 G |
| 4,460,912 | 7/1984 | Takeshita et al. | 357/24 LR |
| 4,471,387 | 9/1984 | Nadler | 357/24 LR |
| 4,527,182 | 7/1985 | Ishihara et al. | 357/24 LR |
| 4,562,474 | 12/1985 | Nishizawa | 357/304 |
| 4,598,305 | 7/1986 | Chiang et al. | 357/24 LR |

Primary Examiner—Andrew J. James
Assistant Examiner—Ngan V. Ngo
Attorney, Agent, or Firm—George L. Craig; Thomas W. DeMond; Melvin Sharp

[57] ABSTRACT

A bulk charge modulated transistor threshold sensing element (12) comprises a first region (18) having an enclosed structure, a gate region (24) that is preferably generally endless in shape, and a second region (26) to the interior of the gate region (24). The gate region (24) is doped and biased such that a potential well (100) is formed in the semiconductor substrate (11) a substantial distance from the surface thereof. When light (90) impinges on the element of the invention, carriers (94) collect in the potential well (100) in response thereto. The carriers (94) affect the threshold voltage of the transistor sensor element, and a threshold voltage differential is sensed as the sensing signal.

14 Claims, 4 Drawing Sheets

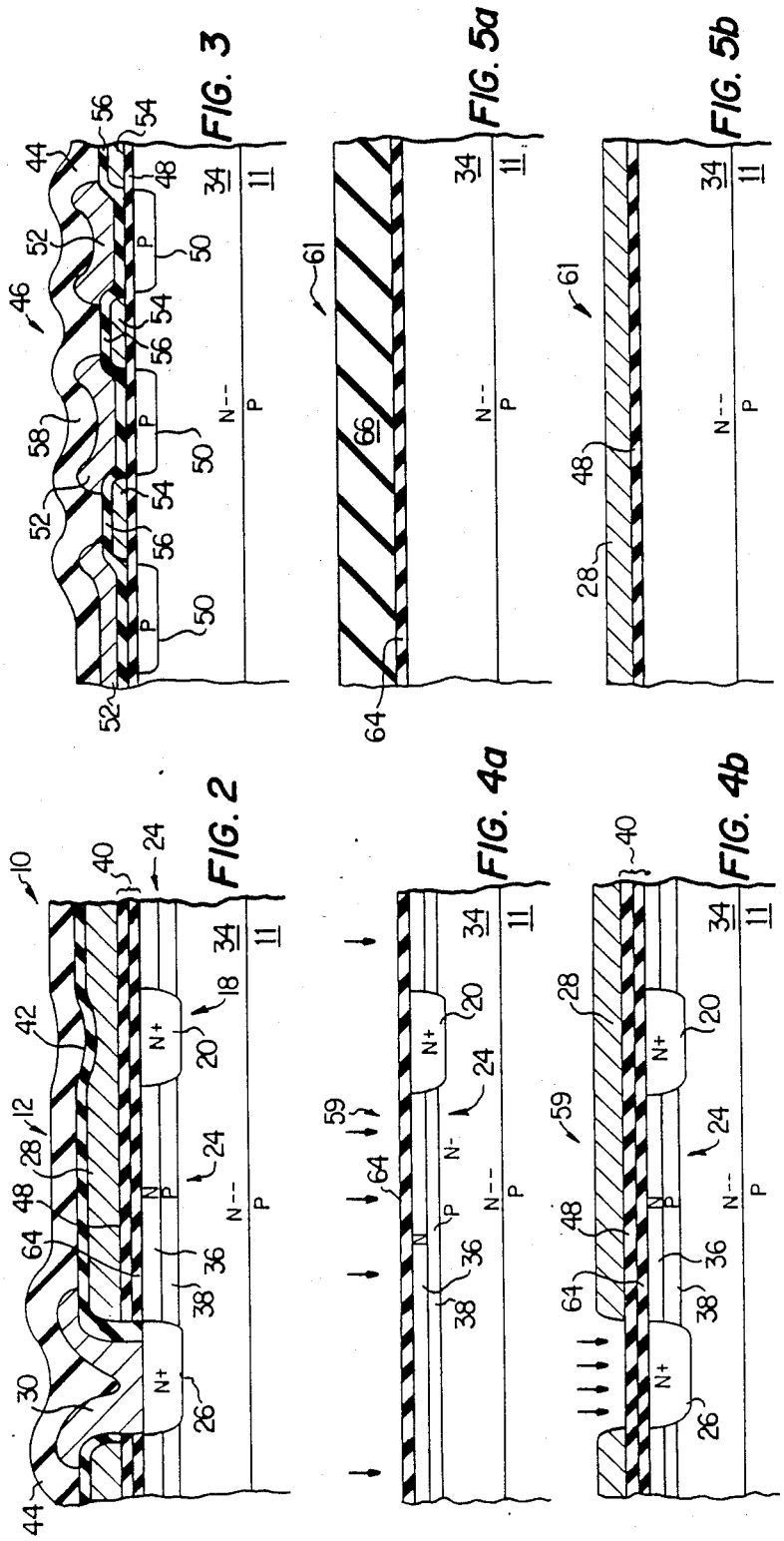

BULK CHARGE MODULATED TRANSISTOR THRESHOLD IMAGE SENSOR ELEMENTS AND METHOD OF MAKING

This application is a continuation of application Ser. No. 036,617 filed Apr. 10, 1987, now abandoned.

TECHNICAL FIELD OF THE INVENTION

This invention relates in general to image sensor elements, and more particularly relates to transistor image sensor elements that can be used to build imaging arrays with no measurable smear, built-in blooming protection, and electronic iris control.

CROSS-REFERENCE TO RELATED APPLICATIONS

The present application incorporates by reference each of the following applications which are related cases having a common inventor and assignee and which contain related subject matter: Ser. No. 033,968, filed 2 Apr. 1987, pending (TI-12270) Horizontal Scanner for Image Sensor Arrays; Ser. No. 037,302, filed 10 Apr. 1987, pending (TI-12271) Image Sensor Array; Ser. No. 034,306, filed 3 Apr. 1987, pending (TI-12479) Floating Gate JFET Image Sensor.

BACKGROUND OF THE INVENTION

Several basic device architectures exist in the art for constructing image sensor arrays. Two of these are the frame transfer and line-address architectures. These architectures generally have a plurality of CCD elements arranged in rows and columns. For each CCD photosite well, an additional well separated by a barrier needs to be fabricated adjacent to it for receiving the stored charge. Further, pixel density is decreased by the requirement of channel stops. In certain of these devices, drains are formed in the channel stops to prevent blooming, and this occupies further array area.

Another class of imagers is arranged according to the interline transfer architecture. These devices comprise a plurality of photosites that can be either empty CCD wells or photodiodes. The photosites are separated by columns of CCD elements provided for readout of the signal. The necessity for the CCD columns decreases pixel density. Channel stops and barriers are required since CCD elements are used in the structure, and this further decreases pixel density.

Yet another class of devices uses an X-Y architecture, wherein each cell or element is individually addressed in the X and Y direction in order to read it out. Conventional X-Y architectures include charge injection devices (CIDs), MOS transistor devices and, more recently, charge-modulated transistor devices. In the CID device, two gates are formed, one connected to a column line, and another connected to a row line. CID arrays have long readout leads, and therefore, have a large parasitic capacitance. This in turn lowers the dynamic range of the device because of the kTC noise associated with the long, high-capacitance readout lines. Further, since each cell is required to be separately read out, the readout of an entire row of cells takes a considerable time. The high-density television (HDTV) format requires that the addressing and readout of an image sensor array used in connection therewith be done within a standard 53.5-microsecond period. Thus, if there are 1000 elements in a row of a CID array device that is operated in the HDTV format, each element in the row must be addressed and read out in 53.5 nanoseconds. This is very difficult to accomplish because of the RC time constant associated with charging up the readout lines, which in turn limits the size of CID image sensor arrays. Further, the relatively large time necessary to read out the row of elements increases smear.

MOS transistor arrays have the same problems as CID arrays relative to their long, large-capacitance sense lines. In addition, the charge from each address element is not amplified, but is instead read out directly on these sense lines. Pixel density of these device arrays is reduced by the requirement of forming either one or two transistors at each photosite for addressing purposes. The kTC noise associated with the long and large-capacitance sensing lines of these X-Y architectures usually degrades the device performance below that of other comparable CCD devices. This noise is a statistical uncertainty in the amount of charge stored on a capacitive element, and equals the square root of the Boltzmann constant (k), multiplied by the absolute temperature (T) and the capacitance of the sense line (C).

Recently, a charge-modulated MOS transistor image sensor element has been devised that can operate in a non-destructive readout mode. This device is described in Matsumoto, K., T. Nakamura, et al., "A New MOS Phototransistor Operating in a Non-Destructive Readout Mode," *Japanese Journal of Applied Physics*, Vol. 24 No. 5, Pages L323–L325 (May, 1985). This element comprises an MOS phototransistor that has an N channel formed in its semiconductor gate region in the bulk. When the gate of the MOS transistor is illuminated, photogenerated holes are stored in the depletion layer under the gate. The stored holes increase the surface potential, resulting in reduction of the potential barrier height at the saddle point for the N-channel carriers. As a result, an amplified current modulated by the surface potential flows in the N bulk channel from source to drain, showing triode-like current-voltage characteristics.

While this MOS phototransistor device has the potential for non-destructive readout, it still has the problem of kTC noise, as the holes stored next the surface of the semiconductor layer will not be entirely swept out by a reset pulse applied to the gate due to the traps existing at the silicon-silicon dioxide interface. The device also suffers from pattern noise since it is designed to modulate the current as will be explained below.

Further, the X-Y architecture of this device is not suitable for use in high-density television (HDTV) applications for reasons discussed in relation to CID elements above. The long readout time exacerbates such problems as smearing, and element to-element charge leakage from unaddressed rows.

The above-mentioned transistor sensing elements have a further disadvantage in that they produce a modulated current as an output signal. This current signal will vary both in relation to the size of the sensing element producing the signal and its threshold voltage. Variations in size and threshold voltage therefore produce "pattern noise." The threshold and size parameters of the sensing elements must therefore be tightly controlled; however, this control becomes progressively more difficult as the size of the element decreases.

A need therefore exists in the industry for a sensor element that has negligible pattern and kTC noise, can be integrated into each photosite, has a high charge-to-voltage conversion sensitivity, has a large charge storage capacity, has resistance to pattern noise, has good blooming overload protection, has a high pixel-to-pixel uniformity and can be arranged for a sufficiently fast readout for use in HDTV applications.

SUMMARY OF THE INVENTION

One aspect of the invention comprises a bulk charge modulated transistor threshold sensing element. The element is formed at a surface of a semiconductor substrate or layer. The element includes a deep buried channel of a first conductivity type. A first region, or drain, of the first conductivity type is formed in the buried channel, and is coupled to a voltage supply source. A gate region is formed in the buried channel laterally adjacent the first region. The gate region is operable to form potential well therein for carriers of a second conductivity type and is formed in the gate region substantially spaced from the surface. A second region of the first conductivity type is formed in the buried channel adjacent the gate region and spaced from the first region. The second region forms a sense node or a source.

A gate insulator is formed over the gate region, and a gate conductor is formed over the gate insulator. The gate conductor is selectively coupled to a pulse source operable to sweep out carriers of the second conductivity type that are collected in the potential well responsive to incident light.

Preferably, the potential well is formed to collect holes, and also acts as a barrier between two electron wells. A first electron well near the surface is used as a probing current well, the probing current supplied from a current source connected to the sense node. A second electron well deeper in the substrate is usually empty, since the carriers accumulating in it are swept from it to a drain.

Structurally, it is preferred that the element have an enclosing, endless first region, although other techniques for isolating adjacent elements from one another are possible.

Another aspect of the invention comprises a method for detecting light by an imaging element. According to the method, a gate region at a surface of a semiconductor layer or substrate is formed that is operable to create a probing current potential well therein of a first conductivity type at its surface, and a charge accumulation potential well therein of a second conductivity type that is substantially spaced from the surface. First and second doped regions of the first conductivity type are formed as laterally spaced from each other by a gate region which includes a second conductivity type region. A supply voltage is connected to the first doped region, and a bias current is supplied to a node connected to the second doped region to cause a probing current to flow through the device. Charge is accumulated in the charge accumulation potential well responsive to light incident on the gate region. This changes the threshold voltage. A changed source region voltage is sensed responsive to the change in threshold voltage. The gate is then pulsed to sweep the accumulated charge out of the accumulation well, to the substrate and to restore the original condition. A normal source voltage is then sensed at the sense node.

Another aspect of the invention comprises a bulk charge modulated transistor threshold image sensor array. The array is formed at a surface of a semiconductor substrate, in which a buried channel of a first conductivity type is formed. Thereafter, a plurality of enclosing, endless first doped regions of the first conductivity type are formed in the buried channel to define a plurality of sensing elements arranged in rows and columns, the first doped regions separating each element from adjacent elements. An enclosing, endless gate region of each element is itself laterally enclosed by a respective first doped region. The gate region is operable to form a potential well therein for carriers of the second conductivity type.

A gate insulator layer is formed over each gate region. Thereafter, a continuous gate conductor is formed for each row of elements that covers the gate insulator layer. A second doped region of the first conductivity type is implanted that is laterally enclosed by a respective gate region. Each gate conductor is selectively connected to a pulse source that is operable, for a selected row, to sweep out carriers of the second conductivity type that are collected in the potential well of each gate region responsive to incident light. Each first doped region is coupled to a supply voltage source, and a continuous second conductor for each column connects the second doped region of each element in the column to a common sense node.

In another aspect of the invention, the first doped region of each bulk charge modulated transistor threshold sensing element is formed from a pair of elongate opposed spaced implanted portions that are separated by a respective gate region. These first portions are mask aligned to the rest of the structure.

A gate insulator layer is formed to extend over both the first doped region and the gate region. A gate conductor layer is formed on the gate insulator layer over the gate region and the first portions of the first doped region. Second portions of the first doped region are formed so as to join together the first portions and produce an enclosed structure, the second portions being self-aligned by the laterally adjacent gate conductor layer. At the same time that the second portions of the first doped region are implanted, a second doped region is implanted into a self-aligned area enclosed by the gate region and the gate conductor layer.

In another aspect of the invention, a CCD register used to store the charge corresponding to the sensed voltage signals is formed simultaneously with the imager array in the same semiconductor substrate.

In a further aspect of the invention, the CCD register may be replaced with other storage and readout means, such as an array of storage capacitors and a horizontal shift register scanner operable to connect at least a selected one of the storage capacitors to a respective output sense line.

BRIEF DESCRIPTION OF THE DRAWINGS

The various aspects of the invention and their advantages will be more completely understood by studying the detailed description below, taken in conjunction with the appended drawings in which:

FIG. 2 is a highly magnified schematic sectional view of an image sensor element according to the invention, corresponding to section 2—2 of FIG. 1;

FIG. 3 is a highly magnified schematic cross sectional view of a CCD output register fabricated on the same substrate with the image sensor element of the invention;

FIGS. 4a–4b are highly magnified schematic sectional views illustrating successive steps in a process of making an image sensor element according to the invention, the views corresponding to the view shown in FIG. 2;

FIGS. 5a–5b are highly magnified schematic sectional views illustrating successive steps in the fabrication process of the invention, the views corresponding to the view shown in FIG. 3;

DETAILED DESCRIPTION OF THE INVENTION

Figure 1:
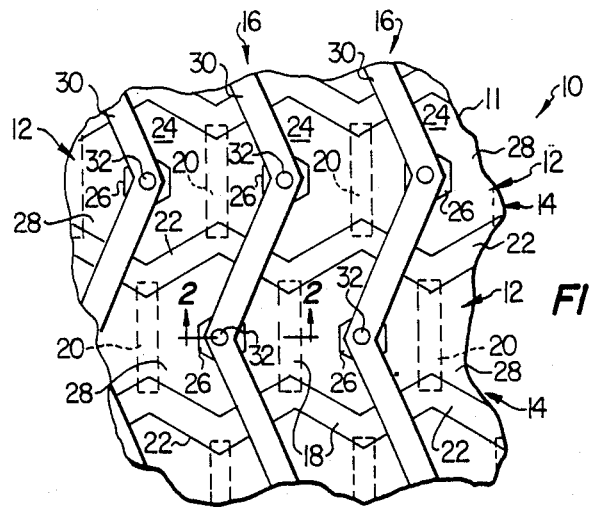
FIG. 1 is a highly magnified plan view of a fragment of an image array according to the invention, certain implanted regions being shown in phantom.

Referring to FIG. 1, a highly magnified fragmentary plan view of an imager array according to the invention is shown generally at 10. Array 10 may be used and formed in conjunction with a CCD register, as will be described for FIGS. 3, 5a–5b and 8. Alternatively, array 10 may be used in conjunction with storage capacitors and a horizontal scanner, as will be described in conjunction with FIG. 8a. Array 10 is formed at a face of a (P—) semiconductor substrate or layer 11, and is comprised of a plurality of image sensor elements or pixels 12 arranged in a plurality of rows 14 and columns 16. Layer 11 is preferably a semiconductor substrate, but can also take the form of an epitaxial layer, or a semiconductor layer on an insulator base such as silicon-on-oxide. As will be subsequently noted, the CCD register is formed on the same substrate as the array 10.

Each sensor element 12 preferably has an enclosed architecture, although other, more complicated isolation techniques could be employed in fabricating a sensor element according to the invention. Each sensor element 12 has an elongate, endless enclosing first doped region 18 formed in layer 11 that is heavily doped to be of the N conductivity type and corresponds to a drain of a MOS transistor. All conductivity types herein described may be reversed; hence, first regions 18 may be P+ as formed in an (N—) semiconductor layer 11, and all further elements of the structure would have similarly reversed conductivity types. A preferred fabrication process detailing how array 10 is formed is described in conjunction with FIGS. 2 and 4a–4b.

Each first region 18 is formed as an endless, enclosing structure. This structure is comprised of a pair of mask-aligned, elongated, rectangular, spaced-apart opposed portions 20 that are shown in phantom. Self-aligned, opposed, saw-toothed second portions 22 of first doped regions 18 connect together portions 20 to make an enclosing, endless doped region 18. The illustrated hexagonal structure of element 12 is preferred over other endless structures, as closest packing of the sensor elements can thus be achieved. Each first doped region 18 not only operates as the "drain" of a respective image sensor element 12, but further separates one such element 12 from adjacent elements 12.

Each image sensor element 12 further has a gate region 24 of a P conductivity type in the semiconductor substrate within first doped region 18. Gate regions 24 are also formed in an endless, generally annular structure. A second N+ doped region 26, corresponding to the source of a MOS transistor, is formed in semiconductor substrate 11 so as to be spaced from endless first doped region 18 and adjacent to gate region 24. Each second doped region 26 is preferably in the center of each element 12 and is laterally enclosed by a respective gate region 24.

For each row 14, a continuous gate insulator (not shown; described in conjunction with FIG. 2) is formed over gate regions 24 and first doped regions 18. A continuous gate conductor 28 for each row is formed on the gate insulator layer over gate regions 24 and first portions 20 of doped regions 18, but not over portions 22 or second regions 26. The gate insulator layer is conveniently formed of silicon dioxide, and gate conductor 28 may be formed of a relatively refractory, conductive and at least light-translucent layer, such as doped polysilicon or, more preferably, doped tin oxide. The specifics of fabricating element 12 will be described in greater detail in conjunction with FIGS. 2 and 4a–4b.

Just as the sensor elements 12 of any particular row 14 are connected together by a respective gate conductor 28, a column conductor 30 is provided for each column 16 to connect the second regions 26 together for each particular column 16 to a respective sense node (not shown). Column conductors 30 and gate conductors 28 are spaced apart by a further insulating layer (not shown). Column conductors 30 may be formed of polysilicon or, more preferably, tin oxide. Column conductors 30 are connected to second N+ regions 26 via contacts 32. The specifics of fabrication will be described in conjunction with FIGURES 2 and 4a–4c.

In the embodiment illustrated in FIG. 1, the elements 12 in any one row are linearly aligned, while columns 16 each have adjacent elements 12 that are offset from each other by one-half pixel. In this configuration, resolution is increased, as there is closer packing of image sensor elements 12 in the array.

FIG. 2 is a highly magnified schematic cross section of imager array 10, corresponding to line 2—2 of FIG. 1. FIG. 2 is not necessarily true to scale, and in particular is exaggerated in a vertical direction to show detail.

A buried channel 34 is implanted and diffused into layer 11; it is lightly doped to be (N—) type. First region portion 20 and the second region 26 are doped to be N+, as shown. Gate region 24, which is formed to extend from first region 20 to second region 26, is doped with P type material such that a region 36 having a lesser concentration of P type material and remains still N type is formed adjacent the surface of semiconductor layer 11, and a region 38 having a greater concentration of P type material is formed. Region 38 extends further into layer 11 than region 36. Additional N type doping can be added into the region 36.

A gate insulator layer 40 separates gate region 24 and region 20 from gate conductor 28. An insulator layer 42 is formed to separate gate conductor 28 from column conductor 30. Insulator layers 40 and 42 can be formed of oxide. A final passivating insulative layer 44 is deposited on top of conductor 30 and insulator layer 42.

FIG. 3 is a schematic sectional diagram of a CCD output register that is formed on the same semiconductor substrate 11 as array 10. As will be more particularly explained in conjunction with FIG. 8, the CCD register is used to store charge proportional to a sensed voltage signals output from array 10. Buried channel 34 is simultaneously implanted into the active device areas of substrate 11 on which array 10 and CCD register 46 will be fabricated. An insulator layer 48 is formed on the surface of semiconductor layer 11. A plurality of spaced barriers 50 are formed in buried channel 34. The illustrated register 46 is a two-phase CCD register, and is provided with conductors 52 and conductors 54. Any conductor 52 and a conductor 54 to its immediate right are connected to a first phase clock (not shown), the next pair of conductors 52 and 54 connected to a second phase clock (not shown), the connections to conductor pairs 52 and 54 thereafter alternating between the first and second phase clocks. Conductors 52 are insulated from conductors 54 by a suitable insulator layer 56, which can be constructed from oxide, and the CCD register is passivated by a layer 58 that can also be formed of oxide. A further, opaque layer (not shown) is deposited over register 56 to prevent incident light from creating unwanted change in the registers.

FIGS. 4a-4b illustrate successive steps in a process for fabricating a bulk charge modulated transistor threshold array (BCMTTA) as shown in FIG. 2. FIGS. 5a-5b illustrate corresponding steps in fabricating the associated CCD output register shown in FIG. 3 in the same semiconductor substrate. Referring first to FIGS. 4a and 5a, a deep (N−) buried channel 34 is implanted into (P−) type semiconductor layer 11 in both an array active device area 59 (FIG. 4a) and a register active device area 61 (FIG. 5a). Phosphorus may be used as the implanted dopant, in which case the implantation concentration should range from $1.0 \times 10^{12}$ to $7.0 \times 10^{12}$ ions/cm$^2$, and the implantation energy should be in the range from 50 to 200 KeV. The subsequent diffusion drives the impurity deep into substrate 11. This can be done by subjecting substrate 11 to a temperature of about 1100° C. for about 24 hours under a nitrogen atmosphere.

Next, a thick field of oxide (not shown) is grown to define active device areas 59 and 61. Then, first, mask aligned portions 20 of enclosing first regions 8 are patterned using photoresist, implanted, and annealed. Where first regions 18 (FIG. 1) are N+, the dopant may be selected to be phosphorus, in which case the implantation concentration should range from $1 \times 10^{15}$ to $5 \times 10^{16}$ ions/cm$^2$ and the implantation energy should be in the range of 50 to 150 KeV.

A first gate insulator layer 64 is thereafter formed in both device areas 59 and 61. First gate insulator layer 64 is preferably formed of oxide, and may be grown from substrate 11 to approximately 600 Angstroms in thickness.

A new photoresist layer 66 is used to pattern a second implant into active device area 59, while masking register area 61. In this embodiment, the second implant is done with a P-type dopant such as boron at an ion concentration in the range from $0.3 \times 10^{12}$ to $3.0 \times 10^{12}$ ions/cm$^2$ and an implantation energy of 120 to 250 KeV. This produces a deep but only moderately doped P-type region 38.

Next, a third implant to array area 59 is done with a N-type implant species. Arsenic may be used. The ion concentration should further be selected to be in the range from $0.8 \times 10^{12}$ to $2.4 \times 10^{12}$ ions/cm$^2$ and the implantation energy should be in the range from 20 to 150 KeV. This implant will define an N region 36. Region 24 should be implanted in such a manner that, upon applying the requisite bias voltage across the element, the valence and conduction potential profiles of FIG. 7 will result. The implants of gate region 24 can be done in any order, a preferred order only being shown.

Referring now to FIGS. 4b and 5b, further fabrication steps of the image array 10 and associated CCD output register 46 are illustrated. In the next step, photoresist layer 66 is stripped from CCD imager area 61. Oxide layer 64 in array area 59 is protected with a mask (not shown) while oxide layer 64 in register area 46 is stripped away. Then, a second gate insulator layer 48 is grown in the image array area 59 and in register area 61. Since oxide layer 64 remains only in image array area 59, the resultant gate insulator layer 48 of register 46 will be less thick than the combined oxide layer 40 of array 10. This gives better process control and allows for different electrical parameters to be set up for imager array 10 than those set up for CCD register 46 or peripheral circuits. The thicknesses of layers 64 and 48 may not be however exactly cumulative. The combined thickness of array gate insulator layer 40 is typically about 1000 Angstroms.

In the next step, from 3000 to 5000 Angstroms of a first polysilicon layer 28 (FIGS. 4b and 5b) (FIG. 5b) is deposited, doped, patterned and etched. Polysilicon layer (gate conductor) 28 extends over the gate regions 24 and first portions 20; of first wells 18; in the CCD register area 61, the polysilicon layer 28 is left intact at this stage.

Alternatively, polysilicon layer 28 can be etched at this stage in both active areas 59 and 61, the etch in CCD area 61 later used to self-align the implant forming CCD barriers 50. In this alternative sequence, the etched areas of layer 28 in register area 61 are protected with photoresist pending the N-type implants performed below.

In place of polysilicon, gate conductor layer 28 can be formed of tin oxide. A tin oxide layer may be deposited by a forced-plasma low-pressure chemical vapor deposition in a plasma reactor. Tetramethyltin and carbon dioxide can be used as the gas reactants in order to deposit the tin oxide layer. To render the tin oxide layer conductive, the reacting gas can contain a small amount of phosphoric oxytrichloride (POCl$_3$) or phosphorous trichloride (PCl$_3$) in the reactant mixture. The tin oxide layer may be patterned using an oxide mask and etched using hydrogen iodide as entrained into the gas flow of an inert gas such as nitrogen. The etch should take place at a temperature below 450° C. Doped tin oxide is a preferred conductor material on array 10 because of its high transparency relative to polysilicon. Further, it is highly resistant to subsequent annealing, etching and oxidation steps.

After gate conductor 28 has been formed, it can be used in a self-aligned process as a mask for an implantation of second regions 26 and the self-aligned portions 22 of first regions 18 (FIG. 1). In the illustrated embodiment, regions 18 and 26 are N+ type. As using phosphorus, regions 26 and region portions 22 can be formed with an implant having an ion implantation concentration in the range of $1\times10^{12}$ to $5\times10^{16}$ ions/cm$^2$ and an ion implantation energy ranging from 60 to 180 KeV.

Referring back to FIGS. 2 and 3, the final stages in fabricating the imager array 10 and register 46 according to the invention are illustrated. In register area 61, layer 28 is patterned and etched to form CCD conductors 54. Conductors 54 are used to self-align an implantation of P-type dopant to form CCD barriers 50. A middle level oxide 42 (FIG. 2) and 56 (FIG. 3) is next deposited over areas 59 and 61, as by low pressure chemical vapor deposition to a thickness of approximately 3000 Angstroms. The oxide is then annealed and preferably densified at 900° C. at 30 minutes under a nitrogen atmosphere. Middle level oxide layer 42 and underlying layers 48 and 64 are then patterned and etched to provide a contact to second doped region 26.

Next, a conductive layer, such as one fabricated out of polysilicon or doped tin oxide, is deposited, patterned and etched to form column conductor 30 (FIG. 2) and CCD phase conductors 52 (FIG. 3) A further oxide layer 44 is deposited over array 10 and CCD register 46, and is subsequently annealed and densified. Off-array metal contacts to conductors 28, 30, 52 and 54 and first regions 18 (not shown) are then patterned and etched, and an aluminum or other metallic conductor is deposited in order to connect these elements to peripheral circuitry.

Figure 6:
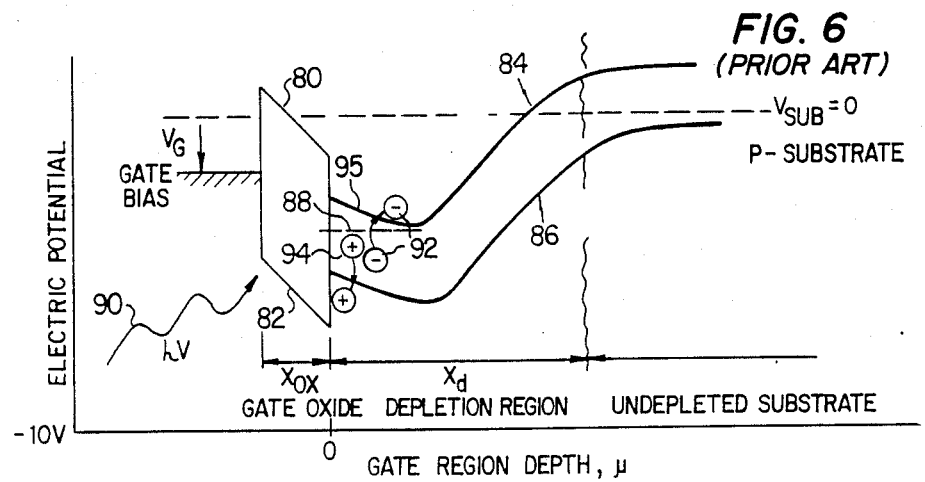
FIG. 6 is a potential band diagram of an image sensor element according to the prior art.
Figure 7:
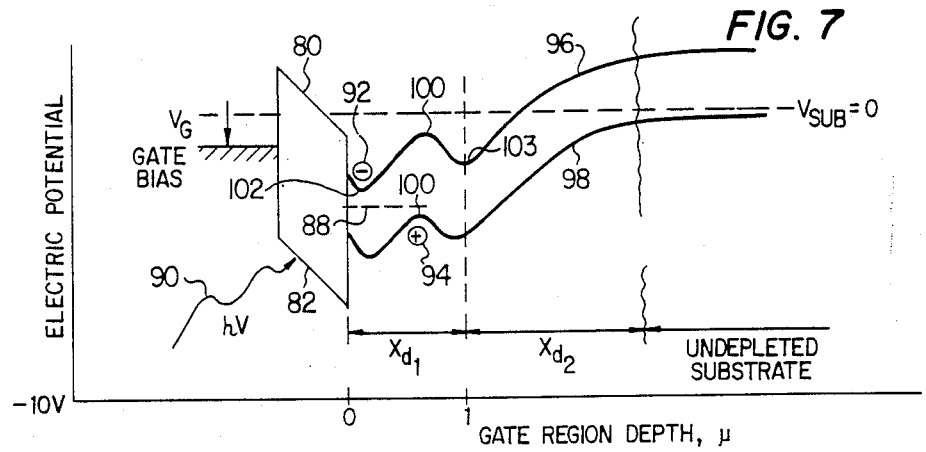
FIG. 7 is a potential band diagram of an image sensor element according to the invention.

Referring now to FIGS. 6 and 7, potential band diagrams of a sensor element according to the prior art and according to the invention are illustrated. FIG. 6 is a typical potential profile diagram of a MOS buried channel transistor that has been connected as a source follower. It is represented as having only a small probing current flowing through it. $V_g$ represents the applied gate bias, where the gate is assumed to be made out of a conductor such as polysilicon or tin oxide. Lines 80 and 82 represent the conduction and valence band potentials for the gate oxide. $X_{ox}$ is the thickness of the gate oxide. Curve 84 is the potential curve for the conduction band of the semiconductor substrate at gate region 24 (See FIG. 2), and curve 86 is the potential curve of the valence band the gate region. $X_d$ is the thickness of a depletion region into the gate region. Level 88 is the electron quasi-Fermi level in the gate region.

If light 90 is permitted to enter through the conductive gate and gate insulator, the depletion region will generate electrons 92 and holes 94. The electrons will flow to channel 95, and the holes will separate and flow to the undepleted substrate or to the surface depending on the place of generation. The potential profile will be altered by the photogenerated holes. Some disadvantages of this structure will be explained below.

However, when the gate region is doped according to the invention, the potential band diagram shown in FIG. 7 results. Distances $X_{d1}$ and $X_{d2}$ represent the respective thicknesses of two depletion regions created by the differential doping of the gate region as described for FIG. 4a above. Respective conduction band and valence band potential curves 96 and 98 result from this differential doping when bias voltage $V_G$ is applied to the gate and where little or no charge has yet been accumulated in the gate region. Curve 98 has a hole potential well 100 formed a substantial distance into the semiconductor layer, and an (N−) electron probing current channel or well 102 near the surface. A second electron well 103 is formed at distance $X_{d1}$, and acts as a barrier to prevent holes from escaping to the substrate. Electron well 103 will usually be empty, as carriers accumulating in it will be swept out to first region 18 (FIGS. 1 and 2).

If light 90 is allowed to enter the structure of the invention, the holes 94 generated in the $X_{d1}$ depletion region will be collected in potential well 100. The space charge accumulated at well 100 will substantially alter the potential profile. Since a probing current flows from source to drain, the number of electrons in the (N−) channel 102 is kept constant, and thus cannot compensate for the added hole charge. The electron quasi-Fermi level 88 will shift following the potential change. This effect will be observed as a MOS transistor threshold shift, and is detectable by the circuit shown in FIG. 8, described below. For detection of a threshold voltage differential, the holes 94 accumulated in well 100 are emptied to the undepleted substrate by pulsing the transistor gate with a positive voltage. After transferring the accumulated charge to the substrate, the element becomes ready for integration of a new hole charge packet.

Since well 100 stores holes a substantial distance from the gate insulator/semiconductor interface rather than at the interface, a positive voltage pulse can completely eliminate the holes from the well 100. Carriers stored at the interface in conventional structures cannot be so completely eliminated due to the traps existing at the interface. The invention therefore has an advantage over other charge modulated transistor threshold devices in that it will generate less kTC noise. The invention has the additional advantage in that voltage, not current, is modulated by the storing of holes in the hole potential well. A voltage threshold differential can therefore be sensed, as will be shown in the description of FIG. 8 below. Since current is not modulated, the controls on impurity concentrations and element sizes need be less strict.

The invention provides automatic blooming protection. As potential well 100 fills with holes, the positive space charge increases, pushing down curves 96 and 98. The filling of well 100 causes it to flatten out such that no new holes can be stored, thus providing a first mechanism for automatic blooming protection. Alternatively, the gate bias $V_g$ can be increased to the bias of first region 18. Electrons from region 18 will then fill current wells 102 and 103 and fix their potentials. Curves 96 and 98 will flatten out, making well 100 shallower. Eventually, well 103 will no longer act as a barrier against newly collected holes and they will escape to the substrate. By either or a combination of these mechanisms, an equilibrium can be created whereby new holes will be automatically swept to the substrate. If the bias of the first region 18 is sufficiently high, the positive gate bias will cause the curves 96 and 98 to change such that the barrier 103 will no longer exist and all the accumulated holes can be transferred into the substrate. This mechanism is used to reset the elements.

The depth of depletion region $X_{d1}$ must not be too shallow, as this would reduce quantum efficiency for incoming light on the red end of the spectrum. Red light penetrates silicon more deeply than blue light. If electron hole pairs are generated by red light in region $X_{d2}$, the holes generated thereby will be lost to the undepleted substrate. Region $X_{d1}$ must therefore be deep enough for well 100 to capture as large a percentage of the holes generated by red light as possible.

Figure 8:
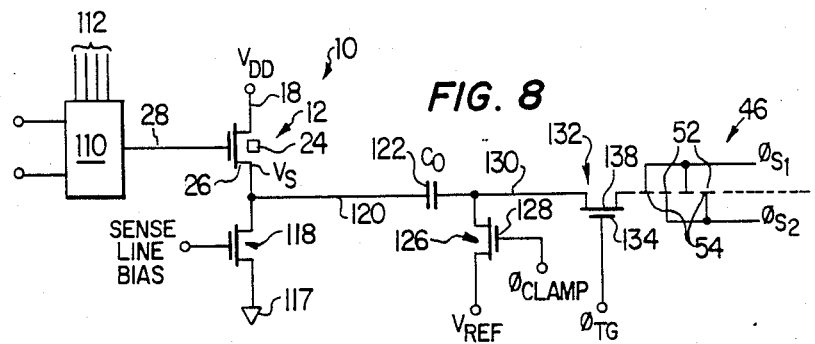
FIG. 8 is a schematic electrical diagram of an image sensor element and associated imager circuitry comprising a CCD register according to the invention.

Referring now to FIG. 8, a circuit for sensing the threshold voltage differential generated by an element 12 of the present invention is schematically shown. A row decoder is indicated schematically at 110. Decoder 110 has a plurality of inputs 112, such as nine inputs, that carry decoder row line address information. Decoder 110 has two voltage sources: a high array bias voltage $V_H$ and a low array bias voltage $V_L$. The address encoded into input 112 selects one particular row line 28 in the image sensor array. Voltage source $V_H$ is connected to row line 28, while voltage source $V_L$ is connected to the other, unselected row lines of sensor elements.

One sensor element in a selected row is indicated generally at 12. Element 12 has a "drain" or a first region 18 that is connected to a supply voltage source $V_{DD}$; a gate region 24; and a second doped region or "source" 26 that is selectively connected to a sense line bias voltage source 117 through a transistor 118. Second doped region 26 is further connected to a sense line 120. Sense line 120 connects second region 26 with a coupling capacitor 122. Coupling capacitor 122 is in turn connected to a reference voltage $V_{REF}$ via a clamping transistor 126. Clamping transistor 126 has a gate 128 that is controlled by a pulse source $\phi_{clamp}$.

A line 130 further connects coupling capacitor 122 to a gating transistor 132. Gating transistor 132 has a gate 134 that is connected to a transfer gate pulse source $\phi_{TG}$. Transistor 132 has a current path 138 that connects line 130 to an input diode of CCD output register 46. Register 46 has a series of storage wells controlled by a series of gates 52 and 54. Gates 52 are connected to a first phase clock source $\phi_{S1}$, while gates 54 are connected to a second phase clock source $\phi_{S2}$.

Figure 9:
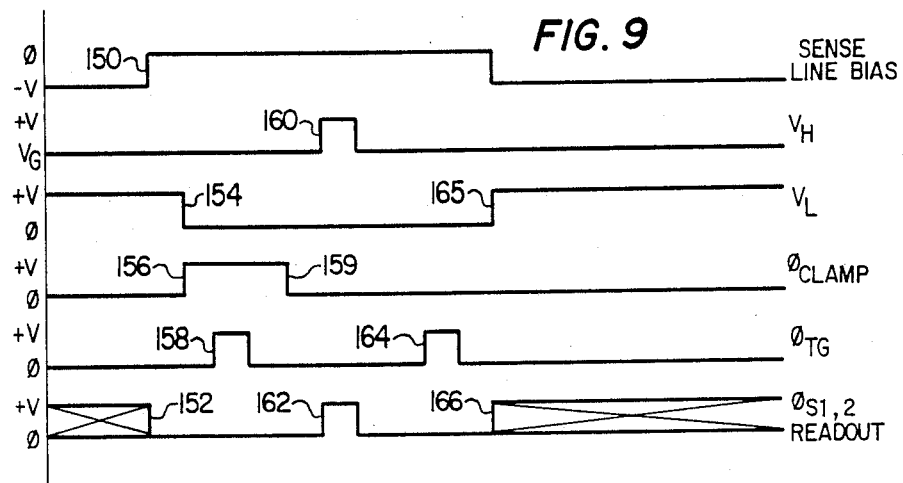
FIG. 9 is a timing diagram for the operation of the circuitry shown in FIG. 8.

The operation of the circuit of FIG. 8 will now be described with the aid of the timing diagram shown in FIG. 9. The operation of the selected element 12 occurs, as applied to a standard TV timing sequence, entirely within a horizontal blanking period. All elements 12 in a selected row are read out in parallel, and this minimizes the smear found in other conventional arrays as the parallel readout can be done very quickly. First, the sense line bias, which was off to save power, is turned on at 150. At or near this time, the horizontal readout phase ends, as indicated on the $\phi_{s1,2}$ readout at point 152. The horizontal blanking time starts at 152. Next, the decoder connects the selected line 28 to the $V_H$ bias and the nonselected lines to the $V_L$ bias at 154. This prevents signal interference from elements in the non-selected element rows and thus eliminates smear. Since the last charge elimination pulse (described below), sensing elements 12 in the selected row have accumulated charge in the potential wells of their gate regions 24. Where holes are accumulated, the threshold voltage will be lowered by an amount $V_h$ related to the number of accumulated holes. The source voltage will correspondingly be raised from an "intrinsic" source voltage $V_s$, which is preferably about seven volts, to a $V_s+V_h$ that is typically about nine volts.

At the same time, transistor 126 is turned on by $\phi_{clamp}$, at 156. This establishes a reference voltage on the right side of capacitor 122. The reference voltage should be selected according to the CCD requirements. Within a few RC time constants of line 120, the voltage on the left side of capacitor 122 will be equal to $V_s+V_h$. The voltage across capacitor 122 at this time is therefore $(V_s+V_h)-V_{REF}$. $V_{REF}$ can be, for example, 5 volts. A charge corresponding to the reference voltage $V_{REF}$ is put into the CCD register 46 by pulsing the transfer gate 134 at time 158. After pulsing the transfer gate, $\phi_{clamp}$ is turned off at time 159, in turn turning off transistor 126 and disconnecting the reference voltage from coupling capacitor 122. In an alternative sequence, $\phi_{clamp}$ may be turned off first and $\phi_{TG}$ turned on thereafter.

Next, the hole well 100 (FIG. 7) is emptied by pulsing the $V_H$ array bias high at time 160. At the same time, the reference charge previously transferred into the CCD register is transferred to a second CCD register (not shown) by pulsing a second transfer gate (not shown). The second CCD register is located alongside the first CCD register 46 such that it can accept the charges in a parallel fashion from register 46. A signal voltage will appear on the left side of capacitor 122 after a few RC time constants of line 120 that is equal to $V_s$. Since the holes causing $V_h$ are no longer present, the voltage threshold is raised and the voltage at source $V_s$ is correspondingly reduced. The voltage on the right side of capacitor 122 will consequently drop from $V_{REF}$ to $V_{REF}-V_h$. A charge corresponding to this value is transferred to CCD register 46 through a transfer gate pulse 164.

This completes the signal transfer sequence from the array 10 into the serial register 46. The address next changes to a dummy row line, and the readout phase of operation begins at 166, at which point CCD register is clocked out serially. The sensing and readout time for one selected row is less than 10 microseconds irrespective of the number of elements in a row, and thus, the invention may be used for HDTV applications.

By the above sensing process, both the reference voltage and the signal voltage are sensed through the same CCD input node. A source of pattern noise is thereby minimized. Further, a source of pattern noise due to variations in intrinsic threshold voltage among sensor elements 12 is eliminated. Since the signal component $V_h$ is not related to sensor transistor size, a further source of pattern noise is precluded.

Figure 8A:
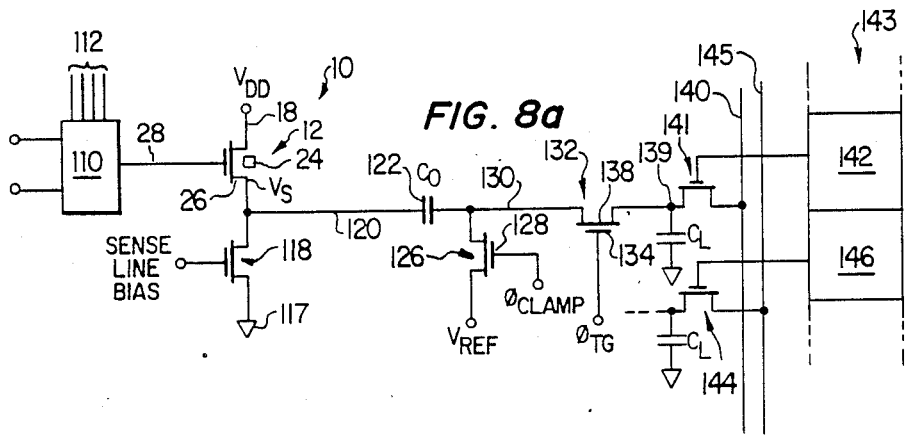
FIG. 8a is a schematic electrical diagram of the storage capacitors and horizontal scanner circuitry that may be used with the image sensor element of the invention in place of the CCD register.

Other means for storage can be employed with the array of the invention. One such alternative means is illustrated by FIG. 8a which is a schematic electrical diagram of an array of storage capacitors and a horizontal scanner stage that replaces CCD register 46. As before, a transfer gate 134 is operable to transfer the signal from line 130 responsive to a transfer gate pulse $\phi_{TG}$. The charge is however transferred to a storage capacitor $C_L$ rather than an input diode of a CCD register. Capacitor $C_L$ is connected between a node 139 and a voltage reference such as ground. Node 139 is connected to a first output sense line 140 by the current path of a switching transistor 141. The gate of switching transistor 141 is connected to a stage 142 of a horizontal scanner indicated generally at 143. In an adjacent column, another capacitor $C_L$ is connected via a switching transistor 144 to a second sense line 145. The gate of switching transistor 144 is controlled by a stage 146 of scanner 143 that is preferably adjacent stage 142. Clock inputs (not shown) are input into stages 142 and 146 in order to respectively actuate switching transistors 141 and 144. In the illustrated embodiment, different clock sources are used to simultaneously clock adjacent stages 142 and 146 in order to simultaneously read out charge stored on adjacent stored capacitor $C_L$ onto sense lines 140 and 145. Alternatively, a single sense line connected to all columns can be employed, in which case stages 142 and 146 are clocked sequentially by a single clock source. Other variations, such as multiple output sense lines, are possible.

Figure 9A:
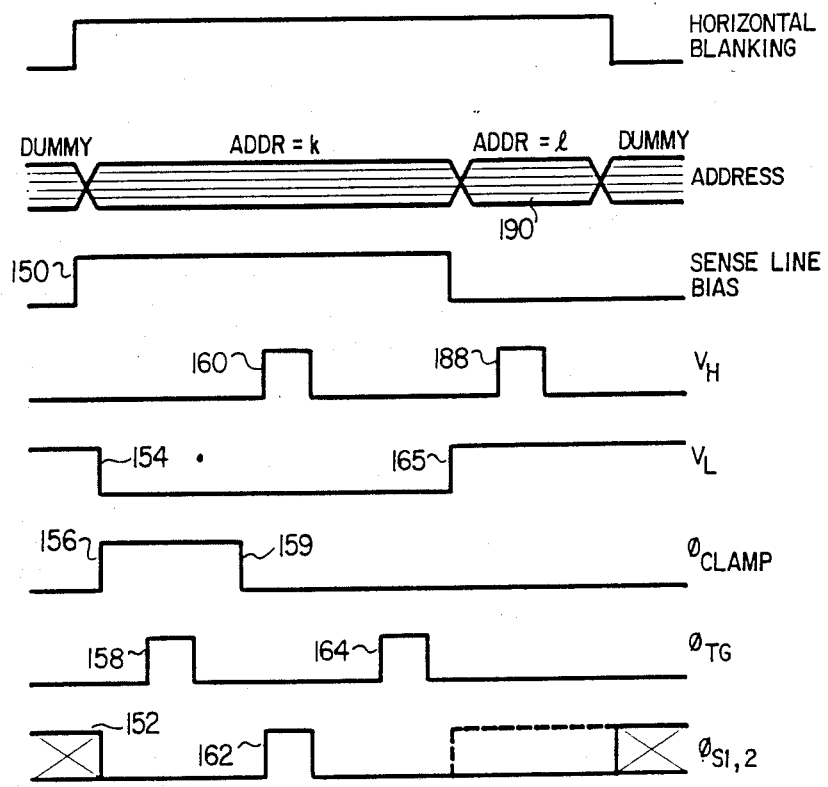
FIG. 9a is an alternate timing diagram, showing operation of the circuitry shown in FIG. 8 as an electronic iris.

FIG. 9a is a timing diagram showing how the array of the invention can be used for automatic exposure control, or an "electronic iris". This effect will be obtained if the charge accumulation time afforded each gate region 24 is reduced. If a charge elimination pulse 188 is applied to gate region 26 (FIG. 1) at an earlier time, there will less opportunity for charge to be accumulated responsive to incident light.

To do this, a second addressed row line 1 is selected at 190 within the same horizontal blanking period, where address 1 is a number of lines removed from address k. Address k is the address of the sensed element. A charge elimination pulse 188 is applied to all gate regions 24 in row 1 but no signals are transferred to CCD register 46 (FIG. 8) for this row. If there are, for example, 525 lines, and the normal TV line period for one row is t, the normal charge accumulation time will be 525 t and will correspond to a wide open mechanical iris. If, on the other hand, an additional address 1 is chosen that precedes address k by a selected number of row lines, the new charge integration time will be $(525-(k-1))t$. This will give a correspondingly shorter integration time, and corresponds to a partially closed mechanical iris.

Figure 10:
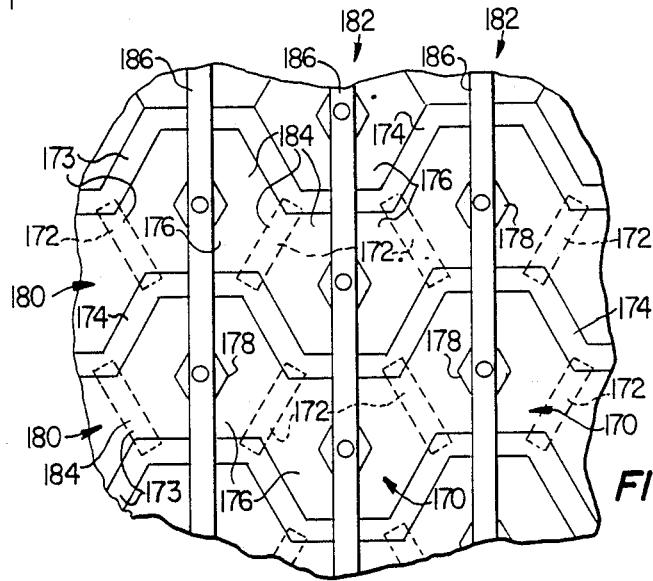
FIG. 10 is a highly magnified plan view of an alternate embodiment of an image sensor array according to the invention.

Referring now to FIG. 10, a highly magnified plan view of an alternate embodiment of an array according to the invention is illustrated. The array in this embodiment comprises a plurality of sensor elements 170 that each correspond to a sensor element 12 of FIG. 1. Each element 170 has rectangular, mask aligned portions 172 of its first region 173, corresponding to portions 20 in FIG. 1, and self-aligned portions 174, corresponding to portions 22 of FIG. 1. Gate regions 176 and second regions 178 in FIG. 10 are similar to gate regions 24 and second doped regions 26 in FIG. 1.

The mask aligned portions 172 of the first doped regions or "drains" of each sensor element 170 are in the form of rectangular sides of an annular hexagon, the sides being 120° removed from each other, rather than 180° removed from each other as in FIG. 1. The self-aligned portions 174 take the somewhat crenellated form shown rather than the zig-zag form of their counterparts 22 shown in FIG. 1.

Second doped region or "source" 178 is located in the center and enclosed by a respective gate region 176. Like the corresponding second regions 26 of FIG. 1, regions 178 are self-aligned. As in the embodiment shown in FIG. 1, elements 172 are arranged in the plurality of rows 180 and columns 182. Rows 180 are defined and separated by the self-aligned portions 174 of the first regions 173. For each row 180, a continuous gate conductor 184 is formed over each gate region 176 in the row and all mask aligned regions 172 in the row. Gate conductors 184 are used to self-align the implant that forms portions 174 and second regions 178.

A column conductor 186 is provided for each column 182, and takes the form of a straight bar. Column conductor 186 is serially connected to each second region 178 in the respective column 182.

Another modification of the array as shown in FIG. 1 may be made that is particularly suited for an interlaced readout operation. According to this alternative embodiment (not shown), the zigzag second conductors 30 are replaced with straight, vertical conductors that are each connected to a sensor element in every other row. A second set of second region or source region conductors is used to connect to the second regions that were not connected by the first set.

In summary, a novel sensing element has been disclosed that has good red-wavelength sensitivity and low kTC noise. The sensor element accumulates carriers in a potential well substantially spaced from the surface of the semiconductor layer into which it is formed, and those carriers influence the threshold voltage of the element. The element modulates threshold voltage rather than current. Pattern noise due to intrinsic threshold variations from sensor to sensor, as well as other process-dependent sources, is minimized. The sensor element minimizes blooming by automatically dumping excess holes to the substrate, and is read out in parallel in a short time so that smear is minimized. A novel sensor element array has further been disclosed that has a high cell packing density and an electronic iris capability.

While preferred embodiments of the invention and their advantages have been described in detail, the invention is not limited thereto but only by the spirit and scope of the claims which follow.

ADVANTAGES OF THE INVENTION

A principal advantage of the sensor element of the invention is its low kTC noise. Another advantage is the element's closest-packing, enclosed structure, whereby the first region or "drain" of each element also serves as a divider between that element and adjacent elements. A further advantage is that a change in threshold voltage, rather than current, is sensed. Another advantage is provided by the circuitry of the invention, wherein errors due to variations in the reference circuitry, sensing element size variations, and intrinsic threshold variations among the sensor elements are eliminated. Another advantage is that many portions of each sense element may be fabricated using a self-aligned process. A further advantage is the ability to simultaneously fabricate a CCD output register on the same chip as the sensing element array with a minimum of extra process steps. Another advantage is obtained with the use of tin oxide as the gate conductor and column conductor material, whereby increased quantum efficiency is achieved. Another advantage is good sensitivity of the sensor element of the invention to red wavelengths. Yet another advantage results from the ability of the sensing cycle of the invention to conform to a conventional horizontal blanking period in HDTV applications. An array fabricated using the element of the invention has an electric iris capability or automatic exposure control, such that the need for a mechanical iris is eliminated. The array further minimizes smear since all array elements in a particular row are read out in parallel in a short time while the rest of the elements is biased off to prevent signal interference. A further advantage of the invention is the provision of a sensor element that has built-in automatic blooming protection.

What is claimed is:

1. A bulk charge modulated MOSFET for sensing light comprising:
   a semiconductor substrate of a first conductivity type;
   a deep buried channel of a semiconductor of a second conductivity type formed in said substrate;
   a gate region formed in said deep buried channel, said gate region having a bulk charge gate region of a first conductivity type and a shallow buried channel region of a second conductivity type formed over said bulk charge gate region, said bulk charge gate region defining a first potential well for charge carriers of a first type and having a voltage threshold potential, said shallow buried channel region defining a second potential well for charge carriers of a second type, said charge carriers of the first and the second type generated in said MOSFET in response to said light incident on said MOSFET;

a source region of a second conductivity type formed in said deep buried channel and extending through said gate region, said source region more heavily doped than said deep buried channel;

a drain region of a second conductivity type formed in said deep buried channel and extending through said gate region, said drain region laterally spaced from and enclosing said source region and more heavily doped than said deep buried channel;

an insulator region formed over said gate and drain regions; and a gate conductor formed over said insulator region and conductively coupled to a source of bias voltage to selectively apply a voltage pulse to said gate conductor changing the voltage threshold potential of said bulk charge gate region and driving the accumulated charge carriers of the first type into the substrate.

2. A bulk charge modulated MOSFET for sensing light as recited in claim 1 including a conductor contact for sensing a change in a threshold voltage of said transistor resulting from the accumulation of the charge carriers of the first type in the bulk charge gate region.

3. A bulk charge modulated MOSFET for sensing incident light comprising:

a semiconductor substrate of a first conductivity type having a deep buried channel region of a second semiconductor type formed therein;

a gate region having a shallow buried channel region of a second conductivity type overlaying a bulk charge gate region of a first conductivity type formed in said deep buried channel region, the incident light creating charge carriers of a first type and a second type in said transistor, said charge carriers of the first type accumulating in a first potential well in said bulk charge gate region;

a supply voltage source coupled to a drain region of said MOSFET;

a current source coupled to a source region of said MOSFET forming a channel current flowing in said shallow buried channel region and creating a second potential well for said charge carriers of said second type, said channel current establishing a threshold potential for said MOSFET; and a sensing circuit for sensing a change in the threshold potential resulting from the accumulation of the charge carriers of the first type in the first potential well.

4. A bulk charge modulated MOSFET for sensing light as recited in claim 3 including a processing circuit coupled to said sensing circuit to produce an output signal proportional to the accumulation of said charge carriers of the first type in said first potential well.

5. A bulk charge modulated MOSFET for sensing light as recited in claim 3 including a gate conductor for selectively applying a voltage pulse to said gate region to sweep the accumulation of charge carriers of the first type in the first potential well into the substrate.

6. A bulk charge modulated MOSFET for sensing light as recited in claim 3 wherein said charge carriers of the first type are holes and said charge carriers of the second type are electrons.

7. A bulk charge modulated MOSFET for sensing light as recited in claim 4 wherein said processing circuit includes a plurality of CCD output registers receiving the output signal.

8. A bulk charge modulated MOSFET for sensing light as recited in claim 4 wherein said processing circuit includes a plurality of storage capacitors and shift registers to 9. A device for sensing impinging light comprising:

a semiconductor substrate of a first conductivity type;

a first semiconductor region of a lightly doped second conductivity type formed in said substrate to produce a deep buried channel;

a second semiconductor region of a heavily doped second conductivity type formed in said first semiconductor region;

a bulk charge gate region of a first conductivity type annularly formed in said first semiconductor region about said second semiconductor region, said bulk charge gate region forming a first potential well for charge carriers of a first type generated by the impinging light;

a shallow buried cannel region of a second conductivity type overlaying said bulk charge gate region, said shallow buried channel region forming a second potential well which is a channel for flow of the charge carriers of the second type generated by the impinging light;

a third semiconductor region of a heavily doped second conductivity type annularly formed in said deep buried channel about said bulk charge gate and shallow buried channel regions; and a gate conductor coupled to a source of bias voltage to selectively apply a voltage pulse to said gate conductor changing the first potential well in the bulk charge gate region to sweep the accumulation of charge carriers of the first type into the substrate.

10. A device for sensing light as recited in claim 9 wherein said first conductivity type is p-type material and said second conductivity type is n-type material.

11. A device for sensing light as recited in claim 9 wherein said first conductivity type is n-type material and said second conductivity type is p-type material.

12. A device for sensing light as recited in claim 9 including a conductor region operably coupled to said second semiconductor region to sense a change in potential of said second semiconductor region arising from the accumulation of said charge carriers of the first type in said bulk charge gate region.

13. A device for sensing light comprising:

a semiconductor substrate of a first conductivity type;

a deep buried channel region of a lightly doped second conductivity type formed in said substrate;

a plurality of spaced apart regions of a heavily doped second conductivity type formed in said deep buried channel region;

a plurality of annular bulk charge gate regions of a first conductivity type formed in said deep buried channel region about said spaced apart regions, charge carriers of a first type created by the light incident on the device accumulating in first potential wells in respective ones of said bulk charge gate regions;

a plurality of annular shallow buried channel regions of a second conductivity type formed in said deep buried channel region, said annular shallow buried channel regions overlaying said bulk charge gate regions, said shallow buried channel regions forming a respective plurality of second potential wells which are flow channels for charge carriers of a second type created by the light incident on the device;

a plurality of annular drain regions of a heavily doped second conductivity type formed in said deep buried channel regions and laterally enclosing said bulk charge gate and shallow buried channel regions, said annular drain regions forming an interconnecting annular array in said deep buried channel region electrically isolating said bulk charge gate and shallow buried channel regions; and a gate conductor region coupled to a source of supply voltage for selectively applying a voltage pulse to said gate conductor region and changing said first potential wells in said bulk charge gate regions to sweep said charge carriers of the first type accumulated in the bulk charge gate regions into the substrate.

14. A device for sensing light as recited in claim 13 including a plurality of conductors conductively coupled to said spaced apart regions to sense a change in potential of said spaced apart regions arising from the accumulation of said charge carriers of the first type in said bulk charge gate regions.

* * * * *